(12) United States Patent
Zhu et al.

(10) Patent No.: US 11,532,611 B2
(45) Date of Patent: Dec. 20, 2022

(54) SILICON CONTROLLED RECTIFIER AND METHOD FOR MAKING THE SAME

(71) Applicant: Shanghai Huali Microelectronics Corporation, Shanghai (CN)

(72) Inventors: Tianzhi Zhu, Shanghai (CN); Guanqun Huang, Shanghai (CN); Haoyu Chen, Shanghai (CN); Hua Shao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 43 days.

(21) Appl. No.: 17/217,517

(22) Filed: Mar. 30, 2021

(65) Prior Publication Data

US 2021/0335775 A1 Oct. 28, 2021

(30) Foreign Application Priority Data

Apr. 28, 2020 (CN) .......................... 202010350856.7

(51) Int. Cl.

| | | |
|---|---|---|
| *H01L 27/02* | (2006.01) | |
| *H01L 29/66* | (2006.01) | |
| *H01L 29/87* | (2006.01) | |

(52) U.S. Cl.
CPC .... *H01L 27/0262* (2013.01); *H01L 29/66386* (2013.01); *H01L 29/87* (2013.01)

(58) Field of Classification Search
CPC ... H01L 29/0642–0649; H01L 27/0262; H01L 29/66386; H01L 29/66098; H01L 29/7436; H01L 29/66393; H01L 27/0266; H01L 27/027; H01L 27/0274; H01L 27/0277; H01L 27/0251; H01L 27/0255; H01L 27/0259
See application file for complete search history.

(56) References Cited

U.S. PATENT DOCUMENTS

2002/0053704 A1* 5/2002 Avery ................. H01L 27/0255
257/361

FOREIGN PATENT DOCUMENTS

| CN | 08183101 | * 12/2017 |
|---|---|---|
| CN | 108183101 B | * 12/2017 |

* cited by examiner

*Primary Examiner* — Wasiul Haider
(74) *Attorney, Agent, or Firm* — Banner & Witcoff, Ltd.

(57) ABSTRACT

The application provides a SCR and a manufacturing method thereof. The SCR comprises: a P-type heavily doped region 20 and an N-type heavily doped region 28 forming an anode formed on the upper part of an N-type well 60, a P-type heavily doped region 26 and an N-type heavily doped region 24 forming a cathode formed on the upper part of a P-type well 70, an active region of the N-type well 60 is between the N-type heavily doped region 28 and an interface of the N-type well 60 and the P-type well 70, a STI is provided between the N-type heavily doped region 24 and the interface, the STI is adjacent to the N-type heavily doped region 24, and an active region of the P-type well 70 is provided between the STI and the interface. The present application can improve trigger voltage of the SCR and save layout area.

16 Claims, 3 Drawing Sheets

SILICON CONTROLLED RECTIFIER AND METHOD FOR MAKING THE SAME

CROSS-REFERENCES TO RELATED APPLICATIONS

This application claims priority to Chinese Patent Application No. 202010350856.7 filed on Apr. 28, 2020, the disclosure of which is incorporated herein by reference in its entirety.

TECHNICAL FIELD

The present application relates to the field of semiconductors, in particular to a no-snapback silicon controlled rectifier structure and a manufacturing method thereof.

BACKGROUND

The electro-static discharge protection design of a high-voltage circuit is always a technical problem, because unlike an ordinary low-voltage device, a high-voltage device (such as an LDMOS), which is the core of the high-voltage circuit, is inapplicable to the electro-static discharge protection design due to very poor characteristics presented by a snapback curve of the high-voltage device, which are reflected in the following two points: 1. a holding voltage (Vh) is excessively low, usually greatly lower than an operating voltage of the high-voltage circuit, so a latch-up effect is easy to occur during normal operation of the high-voltage circuit; and 2. a secondary breakdown current (thermal breakdown current, It2) is excessively low, resulting from localized current crowding of structural characteristics of the device occurring when the LDMOS discharges an ESD current.

Therefore, the following two ideas are usually adopted to achieve the electro-static discharge protection design of the high-voltage circuit in the industry: 1. the structure of the high-voltage device used in an electro-static discharge protection module is adjusted to optimize the snapback curve, so that the high-voltage device is applicable to the electro-static discharge protection design, and the adjustment, however, is difficult to be implemented in practice because of the structural characteristics of the high-voltage device; and 2. a specific number of low-voltage electro-static discharge protection devices are connected in series to form an electro-static discharge protection circuit that can hold a high voltage. Regarding the second idea, because the characteristics of the low-voltage electro-static discharge protection devices are relatively easy to be adjusted and controlled, the industry, in particular integrated circuit design companies, usually prefers the method of connecting a specific number of low-voltage electro-static discharge protection devices in series to implement the electro-static discharge protection design of the high-voltage circuit.

Due to the need for an electro-static discharge protection design window of the high-voltage circuit, there are specific requirements on the snapback characteristics of the low-voltage electro-static discharge devices, that is, the snapback is usually required to be as weak as possible and it is better that there is no snapback, that is, the holding voltage of the snapback is basically the same as a trigger voltage. The low-voltage PMOS device is a common no-snapback electro-static discharge protection device, because a parasitic PNP triode current gain thereof is relatively small when the snapback occurs. However, the defect of the low-voltage PMOS devices lies in a relatively small secondary breakdown current (It2) of the snapback, so the industry continuously performs researches to develop a no-snapback electro-static discharge protection device having a relatively high secondary breakdown current.

The industry proposed a novel no-snapback silicon controlled rectifier (SCR) in 2015. Referring to FIG. 1, the silicon controlled rectifier 100 includes a P-type substrate 180, the P-type substrate is provided with an N-type well 160 and a P-type well 170 therein, and the N-type well 160 and the P-type well 170 are adjacent to each other to form a PN junction at an interface between the N-type well 160 and the P-type well 170. A P-type heavily doped region 122 is formed at the upper portion of the interface between the N-type well 160 and the P-type well 180. An N-type heavily doped region 128, a P-type heavily doped region 120, and an N-type heavily doped region 130 are sequentially formed at the upper portion of the N-type well 160. The P-type heavily doped region 120 and the N-type heavily doped region 130 form an anode A of the silicon controlled rectifier 100. The N-type heavily doped region 128 is close to the P-type heavily doped region 122, and the N-type heavily doped region 128 is spaced from the P-type heavily doped region 122 at a specific distance. The N-type heavily doped region 128, the P-type heavily doped region 120, and the N-type heavily doped region 130 are separated from each other by shallow trench isolation 110. A P-type heavily doped region 126 and an N-type heavily doped region 124 which form a cathode K of the silicon controlled rectifier are formed at the upper portion of the P-type well 170. The N-type heavily doped region 124 is close to the P-type heavily doped region 122, and the P-type heavily doped region 122, the N-type heavily doped region 124, and the P-type heavily doped region 126 are separated from each other by shallow trench isolation 110.

The experimental data of the no-snapback silicon controlled rectifier shown in FIG. 1 indicates that, if the size of the N-type heavily doped region 128 or the P-type heavily doped region 122 reaches a specific level (greater than 4 um), the silicon controlled rectifier presents the no-snapback characteristics, thereby satisfying the requirements of applying low-voltage devices connected in series to the electro-static discharge protection design of the high-voltage circuit. However, the defect of the novel no-snapback silicon controlled rectifier lies in a relatively large device size, in particular a relatively large layout area in multi-stage series connection.

On the basis of the no-snapback silicon controlled rectifier show in FIG. 1, an existing Chinese patent (authorized announcement number: CN108183101B) provides a no-snapback silicon controlled rectifier as shown in FIG. 2 in the industry. A cathode portion of the silicon controlled rectifier 200 shown in FIG. 2 is the same as a cathode portion of the silicon controlled rectifier 100. Corresponding to the N-type heavily doped region 128 in floating connection, an N-type heavily doped region 228 in FIG. 2 is directly connected to an anode A, so that the N-type heavily doped region 228 can effectively reduce the probability of holes injected from a P-type heavily doped region 220 into an N-type well 260 then migrating to an interface between the N-type well 260 and a P-type well 270, that is, the efficiency of the use of the N-type heavily doped region 228 as a guard ring is improved, so the width of the N-type heavily doped region 228 can be designed to be smaller to save the layout area. In addition, the N-type heavily doped region 228 also serves as a pick up point of the N-type well 260, so the N-type heavily doped region 130 serving as a pick up point of the N-type well 260 in the existing no-snapback silicon controlled rectifier shown in FIG. 1 can be removed, thereby further saving the layout area.

However, with the development of the semiconductor technology, the pursuit of saving the layout area is increasing. Therefore, in order to further reduce the layout area occupied by the no-snapback silicon controlled rectifier, it is necessary to further increase the trigger voltage of the no-snapback silicon controlled rectifier, so as to reduce the number of series stages required by application of the multi-stage series connection to the high-voltage electrostatic discharge protection.

In view of the above, there is an urgent need to develop a no-snapback silicon controlled rectifier having a trigger voltage that can be further increased, facilitating the reduction in the number of series stages required by application of the multi-stage series connection to the high-voltage electrostatic discharge protection, and thereby achieving the object of saving the layout area.

BRIEF SUMMARY

A brief overview of one or more aspects is given below to provide a basic understanding of these aspects. The overview is not an exhaustive overview of all of the aspects conceived, and is neither intended to identify key or decisive elements of all of the aspects nor is it attempts to define the scope of any or all of the aspects. The only purpose is to present some concepts of one or more aspects in a simplified form as a prelude to the more detailed description provided later.

In order to further increase a trigger voltage of a no-snapback silicon controlled rectifier to further save a layout area, an aspect of the present application provides a silicon controlled rectifier, specifically comprising:

a P-type substrate (80);

an N-type well (60) and a P-type well (70) located in the P-type substrate (80), wherein an interface is provided between the N-type well (60) and the P-type well (70);

a P-type heavily doped region (20) and an N-type heavily doped region (28) which form an anode of the silicon controlled rectifier and provided at an upper portion of the N-type well (60), wherein the N-type heavily doped region (28) is close to the interface, and an active region of the N-type well (60) is provided between the N-type heavily doped region (28) and the interface; and a P-type heavily doped region (26) and an N-type heavily doped region (24) which form a cathode of the silicon controlled rectifier and provided at an upper portion of the P-type well (70), wherein the N-type heavily doped region (24) is close to the interface, shallow trench isolation (90) is provided between the N-type heavily doped region (24) and the interface, the shallow trench isolation (90) is adjacent to the N-type heavily doped region (24), and an active region of the P-type well (70) is provided between the shallow trench isolation (90) and the interface.

In an embodiment of the silicon controlled rectifier, optionally, the width D1 of the active region between the N-type heavily doped region (28) and the interface is associated with a trigger voltage of the silicon controlled rectifier.

In an embodiment of the silicon controlled rectifier, optionally, the width D1 is 0-2 micrometers.

In an embodiment of the silicon controlled rectifier, optionally, the trigger voltage of the silicon controlled rectifier is also associated with the width D3 of the active region between the shallow trench isolation (90) and the interface.

In an embodiment of the silicon controlled rectifier, optionally, the width D3 is 0-5 micrometers.

In an embodiment of the silicon controlled rectifier, optionally, the active region of the N-type well (60) is provided between the P-type heavily doped region (20) and the N-type heavily doped region (28).

In an embodiment of the silicon controlled rectifier, optionally, the width D2 of the N-type heavily doped region (28) and the width S of the active region between the P-type heavily doped region (20) and the N-type heavily doped region (28) are associated with a no-snapback state of the silicon controlled rectifier.

In an embodiment of the silicon controlled rectifier, optionally, the width D2 is 0.4-10 micrometers, and the width S is 0-2 micrometers.

Another aspect of the present application provides a method for manufacturing a silicon controlled rectifier, specifically comprising steps of:

providing a P-type substrate (80);

forming an N-type well (60) and a P-type well (70) in the P-type substrate (80), wherein an interface is provided between the N-type well (60) and the P-type well (70);

forming a P-type heavily doped region (20) and an N-type heavily doped region (28) which form an anode of the silicon controlled rectifier at an upper portion of the N-type well (60), wherein the N-type heavily doped region (28) is close to the interface, and an active region of the N-type well (60) is provided between the N-type heavily doped region (28) and the interface;

forming a P-type heavily doped region (26) and an N-type heavily doped region (24) which form a cathode of the silicon controlled rectifier at an upper portion of the P-type well (70), wherein the N-type heavily doped region (24) is close to the interface; and forming shallow trench isolation (90) between the N-type heavily doped region (24) and the interface, wherein the shallow trench isolation (90) is adjacent to the N-type heavily doped region (24), and an active region of the P-type well (70) is provided between the shallow trench isolation (90) and the interface.

In an embodiment of the manufacturing method, optionally, the method further comprises adjusting the width D1 of the active region between the N-type heavily doped area (28) and the interface to adjust a trigger voltage of the silicon controlled rectifier.

In an embodiment of the manufacturing method, optionally, the width D1 is 0-2 micrometers.

In an embodiment of the manufacturing method, optionally, the method further comprises adjusting the width D3 of the active region between the shallow trench isolation (90) and the interface to adjust the trigger voltage of the silicon controlled rectifier.

In an embodiment of the manufacturing method, optionally, the width D3 is adjusted in a range of 0-5 micrometers.

In an embodiment of the manufacturing method, optionally, the active region of the N-type well (60) is provided between the P-type heavily doped region (20) and the N-type heavily doped region (28).

In an embodiment of the manufacturing method, optionally, the method further comprises adjusting the width D2 of the N-type heavily doped region (28) and the width S of the active region between the P-type heavily doped region (20) and the N-type heavily doped region (28) to adjust a no-snapback state of the silicon controlled rectifier.

In an embodiment of the manufacturing method, optionally, the width D2 is adjusted in a range of 0.4-10 micrometers, and the width S is adjusted in a range of 0-2 micrometers.

In the silicon controlled rectifier provided in an aspect of the present application, the trigger voltage of the no-snapback silicon controlled rectifier can be increased within a specific range by increasing a reverse breakdown voltage of a parasitic PN diode that determines the trigger voltage, facilitating the reduction in the number of series stages required by application of multi-stage series connection to high-voltage electro-static discharge protection, and thereby achieving the object of saving the layout area. The method for manufacturing a silicon controlled rectifier provided in another aspect of the present application is compatible with an existing CMOS process, and can manufacture a no-snapback silicon controlled rectifier having a trigger voltage that can be further increased, without increasing the manufacturing complexity.

BRIEF DESCRIPTION OF THE DRAWINGS

By reading the detailed description of the embodiments of the present disclosure with reference to the following drawings, the above-mentioned features and advantages of the present application can be better understood. In the drawings, various components are not necessarily drawn to scale, and components with similar related characteristics or features may have the same or similar reference numerals.

REFERENCE NUMERALS

Figure 1:
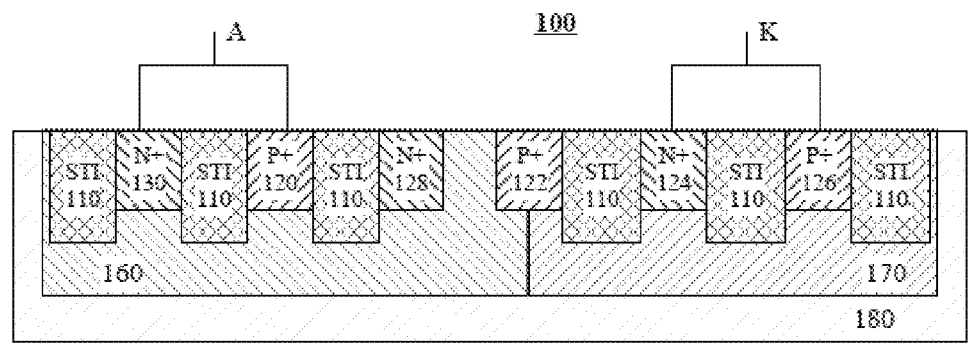
FIG. 1 illustrates a schematic structural diagram of a silicon controlled rectifier in the prior art.
Figure 2:
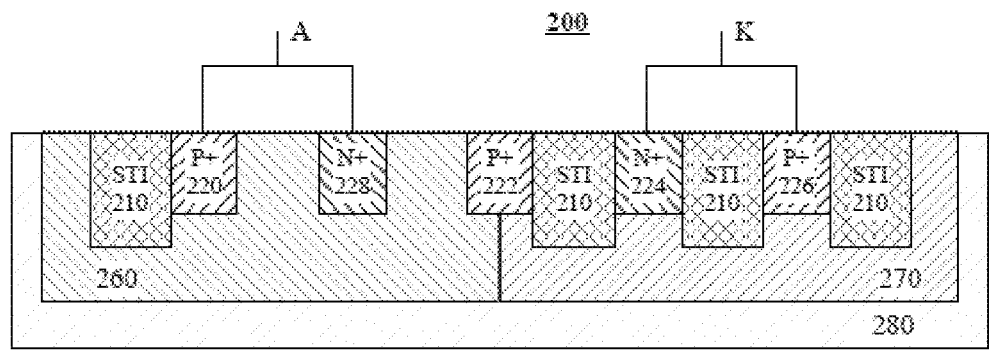
FIG. 2 illustrates a schematic structural diagram of another silicon controlled rectifier in the prior art.

100, 200 Silicon controlled rectifier
110 Shallow trench isolation
120, 122, 126 P-type heavily doped region
124, 128, 130 N-type heavily doped region
160 N-type well
170 P-type well
180 P-type substrate
210 Shallow trench isolation
220, 222, 226 P-type heavily doped region
224, 228 N-type heavily doped region
260 N-type well
270 P-type well
280 P-type substrate
10 Shallow trench isolation
20, 26 P-type heavily doped region
24, 28 N-type heavily doped region
60 N-type well
70 P-type well
80 P-type substrate
90 Shallow trench isolation

DETAILED DESCRIPTION OF THE DISCLOSURE

In order to further increase a trigger voltage of a no-snapback silicon controlled rectifier, the present application provides a silicon controlled rectifier structure and a manufacturing method thereof. The present application further provides other embodiments.

The following description is provided to enable a person skilled in the art to implement and use the present application and apply it into specific application scenarios. Various modifications and various uses in different applications will obvious to a person skilled in the art, and the general principle defined herein can be applied to embodiments in a relatively wide range. Therefore, the present application is not limited to the embodiments given herein, but should be granted the broadest scope consistent with the principle and novel feature disclosed herein.

In the following detailed description, many specific details are set forth to provide a more thorough understanding of the present application. However, it is obvious to a person skilled in the art that the practice of the present application may not necessarily be limited to these specific details. In other words, well-known structures and devices are shown in the form of block diagrams rater than in details, to avoid obscuring the present application.

Readers should pay attention to all files and documents submitted along with this specification and open to the public for consulting this specification, and the contents of all of the files and documents are incorporated hereinto by reference. Unless otherwise directly stated, all the features disclosed in this specification (including any appended claims, abstract, and drawings) can be replaced by alternative features for achieving the same, equivalent, or similar purpose. Therefore, unless otherwise expressly stated, each feature disclosed is merely an example of a set of equivalent or similar features.

It should be noted that when used, the signs left, right, front, rear, top, bottom, front, back, clockwise, and counterclockwise are only used for the purpose of convenience, and do not imply any specific direction. In fact, they are used to reflect a relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Furthermore, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

As stated above, the present application provides a no-snapback silicon controlled rectifier having a trigger voltage that can be further increased and a manufacturing method thereof. Specifically, FIG. 3 illustrates a schematic flowchart of the manufacturing method provided by the present application for manufacturing the silicon controlled rectifier shown in FIG. 4.

Figure 3:
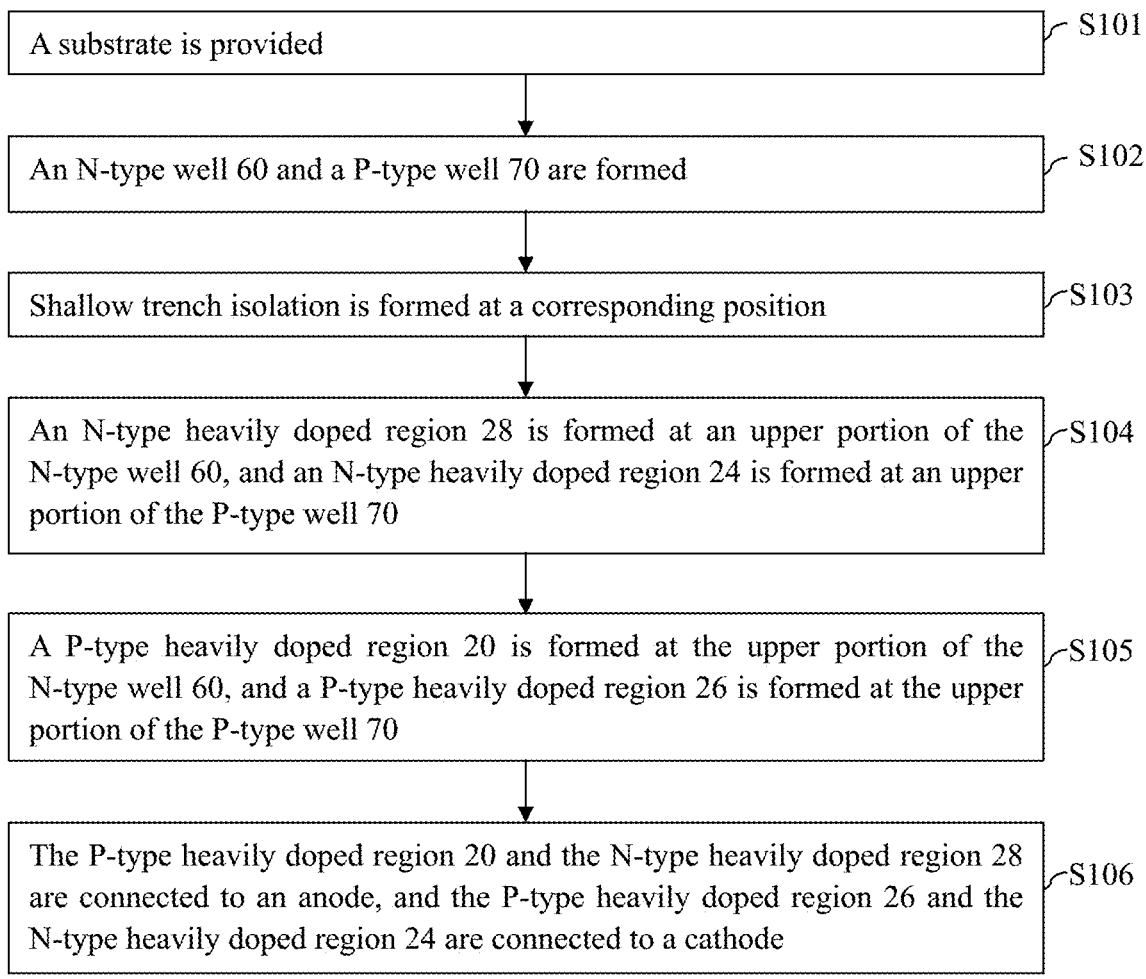
FIG. 3 illustrates a schematic flowchart of an embodiment of a method for manufacturing a silicon controlled rectifier provided in an aspect of the present application.

Referring to FIG. 3, step S101 is performed, that is, a substrate is provided. The substrate can be a semiconductor wafer, such as a silicon wafer. Alternatively or additionally, the substrate can include an elemental semiconductor material, a compound semiconductor material, and/or an alloy semiconductor material. Examples of the elemental semiconductor material may be but are not limited to crystalline silicon, polycrystalline silicon, amorphous silicon, germanium, and/or diamond. Examples of the compound semiconductor material may be but are not limited to silicon carbide, gallium arsenide, gallium phosphide, indium phosphide, indium arsenide, and/or indium antimonide. Examples of the alloy semiconductor material may be but are not limited to SiGe, GaAsP, AlInAs, AlGaAs, GaInAs, GaInP, and/or GaInAsP. In an embodiment, the substrate is a P-type doped substrate.

Step S102: An N-type doped well 60 and a P-type doped well 70 are formed. The formation of each well includes at least three to five steps to complete the formation, including but not limited to epitaxial growth, original oxidation growth, ion implantation using a mask, high-energy secondary ion implantation, and an annealing operation.

In step S102, the formed N-type well 60 is adjacent to the P-type well 70, an interface is provided between the N-type well 60 and the P-type well 70, and a PN junction can be formed at the interface.

Step S103: shallow trench isolation (STI) is formed at a corresponding position. The shallow trench isolation process (STI) includes but is not limited to shallow trench etching, oxide filling, and oxide planarization. The shallow trench etching includes but is not limited to oxide layer isolation, nitride precipitation, shallow trench isolation using a mask, and STI shallow trench etching. The STI oxide filling includes but is not limited to trench liner silicon oxide, trench chemical vapor deposition (CVD) oxide filling, or physical vapor deposition (PVD) oxide filling. The planarization of the silicon wafer surface can be implemented by means of a variety of methods. The planarization of the silicon wafer can be implemented by filling a gap with spin-on-glass (SOG), wherein the SOG can consist of 80% of solvent and 20% of silicon dioxide, the SOG is baked after deposition, the solvent is evaporated, the silicon dioxide is left in the gap, and etching-back of the entire surface can also be performed to reduce the thickness of the entire silicon wafer. The planarization processing can also be effectively implemented by means of a CMP process (also referred to as a polishing process), including but not limited to polishing (chemical mechanical polishing can be adopted) of the trench oxide and nitride removal. A person skilled in the art should know that electrical isolation between devices on the substrate can be effectively implemented by means of the shallow trench isolation.

Step S104: An N-type heavily doped region 28 is formed at an upper portion of the N-type well 60 close to the interface, and an N-type heavily doped region 24 is formed at an upper portion of the P-type well 70 close to the interface. In this embodiment, N-type doping may have dopants, such as arsenic (As), phosphorus (P), other group V elements, or a combination thereof. In an embodiment, the N-type heavily doped region 28 and the N-type heavily doped region 24 have the same ion doping concentration. The N-type heavily doped region 28 is spaced from the interface between and the P and N wells by a distance, that is, an active region of the N-type well 60 is provided between the N-type heavily doped region 28 and the interface between and the P and N wells. The shallow trench isolation 90 formed in step S103 is provided between the N-type heavily doped region 24 and the interface between the P and N wells. The shallow trench isolation 90 is adjacent to the N-type heavily doped region 24. The shallow trench isolation 90 is spaced from the interface between the P and N wells by a distance S, that is, an active region of the P-type well 70 is provided between the shallow trench isolation 90 and the interface between and the P and N wells.

Since the N-type well 60 with the width D1 and the P-type well 70 with the width D3 are respectively provided on two sides of the interface, after a P-type doped region originally provided at the interface is removed, a reverse breakdown voltage of a parasitic diode P-type well 70/N-type well 60 (N-type heavily doped region 28) inside the silicon controlled rectifier is determined by the width D1 of the active region of the N-type well 60 between the N-type heavily doped region 28 and the interface and the width D3 of the active region of the P-type well 70 between the shallow trench isolation 90 and the interface.

In the above embodiment, after the P-type doped region originally provided at the interface is removed, since the ion doping concentration of a P terminal of the parasitic PN diode is excessively low, basically equivalent to that of the N-type well 60, an upper limit of the reverse breakdown voltage of the parasitic P-i-N diode inside the silicon controlled rectifier that determines the trigger voltage is not determined by a PN junction formed by the P+/N-type well 60, but is determined by a PN junction formed by the P-type well 70 and the N-type well 60. That is, compared with an existing structure, the reverse breakdown voltage can be increased, thereby increasing the trigger voltage of the snapback effect.

By increasing the reverse breakdown voltage of the parasitic PN diode inside the silicon controlled rectifier that determines the trigger voltage, the trigger voltage of the silicon controlled rectifier can be effectively increased within a specific range, thereby improving the device performance without changing the device size. In other words, the design size of the device can be reduced within a specific range in the case of maintaining the trigger voltage, thereby saving a layout area.

In an embodiment, the trigger voltage of the silicon controlled rectifier is adjusted by adjusting the width D1 of the active region of the N-type well between the N-type heavily doped region 28 and the interface. In an embodiment, the width D1 can be adjusted to 0-2 um to adjust the trigger voltage, so that the silicon controlled rectifier has trigger voltages that satisfy different needs.

In another embodiment, the trigger voltage of the silicon controlled rectifier is also adjusted by adjusting the width D3 of the active region between the shallow trench isolation 90 and the interface. The width D3 of the active region between the shallow trench isolation 90 and the interface may affect the width of a depletion region of a portion of the parasitic diode P-type well 70/N-type well 60 (N-type heavily doped region 28) in the P-type well 70, imposing an impact onto the reverse breakdown voltage of the parasitic PN diode, and thereby affecting the trigger voltage of the silicon controlled rectifier. In an embodiment, the width of D3 can be adjusted in a range of 0-5 um to adjust the trigger voltage of the formed silicon controlled rectifier.

In the above embodiment, the N-type heavily doped region 28 is directly connected to an anode A, so that the N-type heavily doped region 28 can effectively reduce the probability of holes injected from a P-type heavily doped region 20 into the N-type well 60 then migrating to an interface between the N-type well 60 and the P-type well 70, that is, the efficiency of the use of the N-type heavily doped region 28 as a guard ring is improved, so the width of the N-type heavily doped region 28 can be designed to be smaller to save the layout area. It can be understood that, in the above embodiment, the N-type heavily doped region 28 and the N-type heavily doped region 24 have the same ion doping concentration, so as to ensure the efficiency of the use of the N-type heavily doped region 28 as a guard ring.

Step S105: a P-type heavily doped region 20 is formed at the upper portion of the N-type well 60, and a P-type heavily doped region 26 is formed at the upper portion of the P-type well 70. In this embodiment, P-type doping may have dopants, such as boron (B) or other group III elements. In an embodiment, it can be understood that the P-type heavily doped region 20 and the P-type heavily doped region 26 have the same ion doping concentration.

With reference to step S103, it can be determined that the active region of the N-type well 60 is provided between the P-type heavily doped region 20 and the N-type heavily doped region 28 in the N-type well 60. The provision of the active region between the P-type heavily doped region 20 and the N-type heavily doped region 28, i.e., a structure with no shallow trench isolation, may affect the distribution of carrier holes injected from P+20 into the N-type well 60. In a cathode portion of the silicon controlled rectifier, shallow trench isolation is provided between the P-type heavily doped region 26 and the N-type heavily doped region 24.

Step S106: the P-type heavily doped region 20 and the N-type heavily doped region 28 are connected to an anode, and the P-type heavily doped region 26 and the N-type heavily doped region 24 are connected to a cathode. Connecting the N-type heavily doped region 28 directly to the anode A can effectively improve the efficiency of the use of the N-type heavily doped region 28 as a guard ring, and furthermore, the N-type heavily doped region 228 also serves as a pick up point of the N-type well 60, so that no additional N-type doped region for picking up the N-type well 60 is required, thereby saving the layout area.

It should be noted that, although the procedure of the manufacturing method provided in an aspect of the present application is described using a mode, in which the shallow trench isolation is formed first, then the N-type doped region is formed, and finally the P-type doped region is formed, actually, a person skilled in the art could form the shallow trench isolation, the N-type doped region, and the P-type doped region according to an existing or future procedure. An order of forming the shallow trench isolation, the N-type doped region, and the P-type doped region shall not limit the protection scope of the present application inappropriately.

Accordingly, the no-snapback silicon controlled rectifier having a trigger voltage that can be further increased is formed according to the manufacturing method provided in an aspect of the present application. In addition, the manufacturing process is compatible with the existing CMOS process, without increasing the manufacturing complexity and manufacturing cost.

More specifically, in an embodiment of the manufacturing method provided in an aspect of the present application, a no-snapback state of the silicon controlled rectifier can be adjusted by adjusting the width D2 of the N-type heavily doped region 28 and the width S of the active region between the P-type heavily doped region 20 and the N-type heavily doped region 28. In an embodiment, D2 can be adjusted to 0.4-10 um and the width S can be adjusted to 0-2 um, so as to adjust whether the silicon controlled rectifier enters the no-snapback state.

Specifically, if D2 is larger, the silicon controlled rectifier is more likely to enter the no-snapback state. A person skilled in the art could determine appropriate D2 according to difficulty degrees required for entering the no-snapback state. In addition, the distribution of the carrier holes injected from P+20 into the N-type well 60 can be improved by adjusting the width S of the active region between the P-type heavily doped region 20 and the N-type heavily doped region 28, to improve the efficiency of the use of the N-type heavily doped region 28 as a guard ring, i.e., improving the efficiency of recombination annihilation of the carrier holes performed by the N-type heavily doped region 28.

Figure 4:
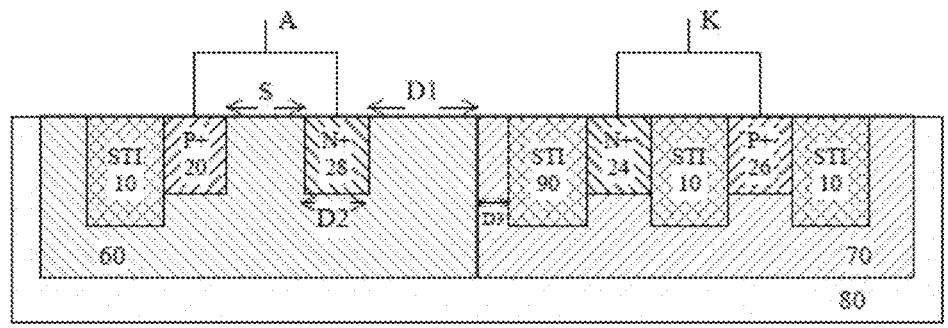
FIG. 4 illustrates a schematic structural diagram of an embodiment of a silicon controlled rectifier provided in an aspect of the present application.

FIG. 4 illustrates a schematic structural diagram of the silicon controlled rectifier provided in another aspect of the present application. Referring to FIG. 4, the silicon controlled rectifier provided by the present application includes the P-type substrate 80. An N-type well 60 and a P-type well 70 are formed at an upper portion of the P-type substrate 80, an interface is provided between the N-type well 60 and the P-type well 70, and a PN junction is formed at the interface. A P-type heavily doped region 20 and an N-type heavily doped region 28 which form an anode of the silicon controlled rectifier are provided at an upper portion of the N-type well 60, the N-type heavily doped region 28 is close to the interface, and an active region of the N-type well 60 is provided between the N-type heavily doped region 28 and the interface. A P-type heavily doped region 26 and an N-type heavily doped region 24 which form a cathode of the silicon controlled rectifier are provided at an upper portion of the P-type well 70, the N-type heavily doped region 24 is close to the interface, shallow trench isolation 90 is provided between the N-type heavily doped region 24 and the interface, the shallow trench isolation 90 is adjacent to the N-type heavily doped region 24, and an active region of the P-type well 70 is provided between the shallow trench isolation 90 and the interface.

Since the N-type well 60 with the width D1 and the P-type well 70 with the width D3 are respectively provided on two sides of the interface, a reverse breakdown voltage of a parasitic diode P-type well 70/N-type well 60 (N-type heavily doped region 28) inside the silicon controlled rectifier is determined by the width D1 of the active region of the N-type well 60 between the N-type heavily doped region 28 and the interface and the width D3 of the active region of the P-type well 70 between the shallow trench isolation 90 and the interface. After the P-type doped region originally provided at the interface is removed, the ion doping concentration of a P terminal of the parasitic diode is reduced, thereby increasing the reverse breakdown voltage of the parasitic diode. The reverse breakdown voltage determines the trigger voltage of the silicon controlled rectifier. Therefore, the trigger voltage of the silicon controlled rectifier can be effectively increased within a specific range. In other words, the design size of the device can be reduced within a specific range in the case of maintaining the trigger voltage, thereby saving the layout area.

In an embodiment, the trigger voltage of the silicon controlled rectifier is adjusted by adjusting the width D1 of the active region of the N-type well between the N-type heavily doped region 28 and the interface. In an embodiment, the width D1 can be adjusted to 0-2 um to adjust the trigger voltage, so that the silicon controlled rectifier has trigger voltages that satisfy different needs.

In the above embodiment, the trigger voltage of the silicon controlled rectifier is also associated with the width D3 of the active region between the shallow trench isolation 90 and the interface. The width D3 of the active region between the shallow trench isolation 90 and the interface may affect the width of a depletion region of a portion of the parasitic diode P-type well 70/N-type well 60 (N-type heavily doped region 28) in the P-type well 70, imposing an impact onto the reverse breakdown voltage of the parasitic diode, and thereby affecting the trigger voltage of the silicon controlled rectifier. In an embodiment, the width of D3 can be adjusted in a range of 0-5 um, so that the silicon controlled rectifier has trigger voltages that satisfy different needs.

In the above embodiment, the N-type heavily doped region 28 is directly connected to the anode A, so that the N-type heavily doped region 28 can effectively reduce the probability of holes injected from the P-type heavily doped region 20 into the N-type well 60 then migrating to the interface between the N-type well 60 and the P-type well 70, that is, the efficiency of the use of the N-type heavily doped region 28 as a guard ring is improved, so the width of the N-type heavily doped region 28 can be designed to be smaller to save the layout area. It can be understood that, in the above embodiment, the N-type heavily doped region 28 and the N-type heavily doped region 24 have the same ion doping concentration, so as to ensure the efficiency of the use of the N-type heavily doped region 28 as a guard ring.

Referring to FIG. 4, the active region of the N-type well 60 is provided between the P-type heavily doped region 20 and the N-type heavily doped region 28 in the N-type well 60 of the silicon controlled rectifier provided by the present application. The provision of the active region between the P-type heavily doped region 20 and the N-type heavily doped region 28, i.e., a structure with no shallow trench isolation, may affect the distribution of carrier holes injected from P+20 into the N-type well 60. In a cathode portion of the silicon controlled rectifier, shallow trench isolation is provided between the P-type heavily doped region 26 and the N-type heavily doped region 24.

More specifically, the width D2 of the N-type heavily doped region 28 and the width S of the active region between the P-type heavily doped region 20 and the N-type heavily doped region 28 are associated with a no-snapback state of the silicon controlled rectifier. If D2 is larger, the silicon controlled rectifier is more likely to enter the no-snapback state. A person skilled in the art could determine appropriate D2 according to difficulty degrees required for entering the no-snapback state. In addition, the distribution of the carrier holes injected from P+20 into the N-type well 60 can be improved by adjusting the width S of the active region between the P-type heavily doped region 20 and the N-type heavily doped region 28, to improve the efficiency of the use of the N-type heavily doped region 28 as a guard ring, i.e., improving the efficiency of recombination annihilation of the carrier holes performed by the N-type heavily doped region 28. In an embodiment, D2 is in a range of 0.4-10 um, and S is in a range of 0-2 um.

As stated above, in the silicon controlled rectifier provided in an aspect of the present application, the trigger voltage of the no-snapback silicon controlled rectifier can be increased within a specific range by increasing the reverse breakdown voltage of the parasitic PN diode that determines the trigger voltage, facilitating the reduction in the number of series stages required by application of multi-stage series connection to high-voltage electro-static discharge protection, and thereby achieving the object of saving the layout area. The method for manufacturing a silicon controlled rectifier provided in another aspect of the present application is compatible with an existing CMOS process, and can manufacture a no-snapback silicon controlled rectifier having a trigger voltage that can be further increased, without increasing the manufacturing complexity.

Figure 5:
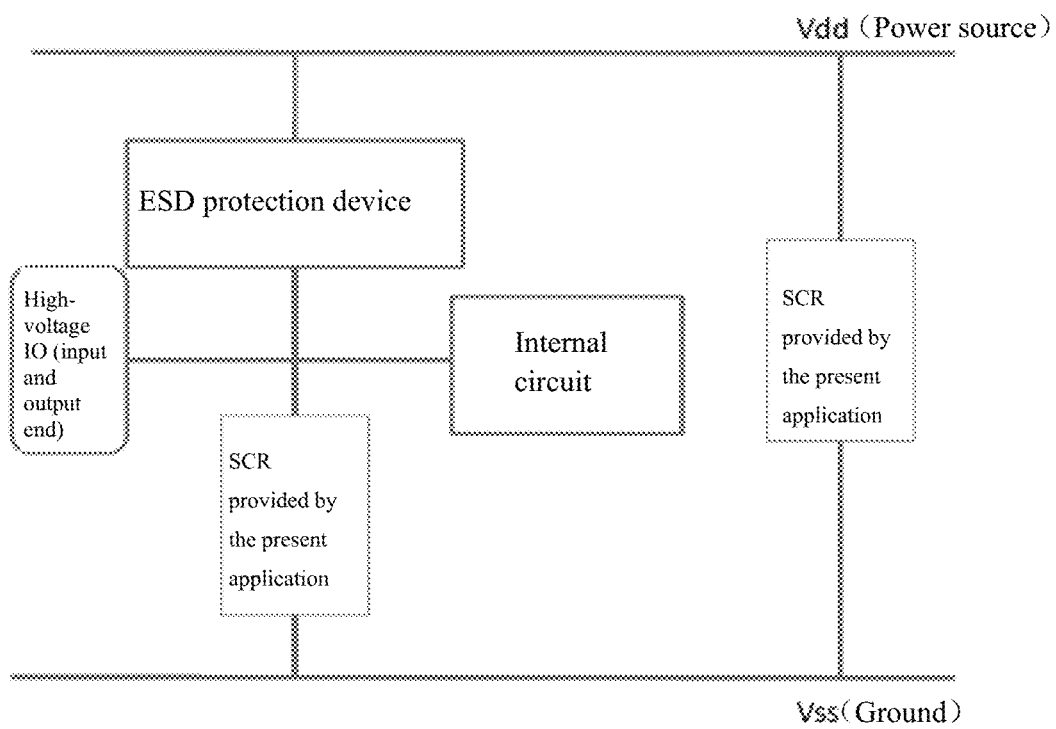
FIG. 5 illustrates a schematic diagram of an application scenario of the silicon controlled rectifier provided in an aspect of the present application.

FIG. 5 illustrates a schematic diagram of an application scenario of the silicon controlled rectifier provided by the present application. Referring to FIG. 5, the silicon controlled rectifier provided by the present application is applied to an ESD protection circuit to effectively protect the circuit.

The embodiments of a silicon controlled rectifier and a manufacturing method thereof are described above. Although the present disclosure is described with respect to specific exemplary embodiments, it is obvious that various modifications and changes can be made to these embodiments without departing from the broader spirit and scope of the present disclosure. Therefore, the specification and drawings should be construed as being illustrative rather than restrictive.

It should be understood that this specification will not be used to interpret or limit the scope or meaning of the claims. In addition, in the foregoing detailed description, it can be seen that various features are combined together in a single embodiment for the purpose of simplifying the present disclosure. The method of the present disclosure should not be construed as reflecting that the claimed embodiments require more features than those explicitly listed in each claim. On the contrary, as reflected in the appended claims, the inventive subject matter includes features less than all the features of a single disclosed embodiment. Therefore, the appended claims are hereby incorporated into the detailed description, with each claim independently used as an independent embodiment.

An embodiment or embodiments mentioned in the description are intended to be included in at least one embodiment of a circuit or method in combination with the specific features, structures, or characteristics described in the embodiment. The phrase "one embodiment" in various portions of the specification does not necessarily refer to the same embodiment.

What is claimed is:

1. A silicon controlled rectifier, comprising:
   a P-type substrate;
   an N-type and a P-type well located in the P-type substrate, wherein an interface is provided between the N-type well and the P-type well, the interface extending from a bottom of the N-type well and the P-type well to a top surface of the substrate;
   a first P-type heavily doped region and a first N-type heavily doped region which form an anode of the silicon controlled rectifier and are provided at an upper portion of the N-type well, wherein the first N-type heavily doped region is closer to the interface than the first P-type heavily doped region, and an active region between the first N-type heavily doped region and the interface is composed of the N-type well; and
   a second P-type heavily doped region and a second N-type heavily doped region which form a cathode of the silicon controlled rectifier and are provided at an upper portion of the P-type well, wherein the second N-type heavily doped region is closer to the interface than the second P-type heavily doped region, shallow trench isolation is provided between the second N-type heavily doped region and the interface, the shallow trench isolation is adjacent to the second N-type heavily doped region, and an active region between the shallow trench isolation and the interface is composed of the P-type well.

2. The silicon controlled rectifier according to claim 1, wherein a width D1 of the active region between the first N-type heavily doped region and the interface is associated with a trigger voltage of the silicon controlled rectifier.

3. The silicon controlled rectifier according to claim 2, wherein the width D1 is 1-2 micrometers.

4. The silicon controlled rectifier according to claim 2, wherein the trigger voltage of the silicon controlled rectifier is also associated with a width D3 of the active region between the shallow trench isolation and the interface.

5. The silicon controlled rectifier according to claim 4, wherein the width D3 is 1-5 micrometers.

6. The silicon controlled rectifier according to claim 1, wherein the active region of the N-type well is provided between the first P-type heavily doped region and the first N-type heavily doped region.

7. The silicon controlled rectifier according to claim 6, wherein a width D2 of the first N-type heavily doped region and a width S of the active region between the first P-type heavily doped region and the first N-type heavily doped region are associated with a no-snapback state of the silicon controlled rectifier.

8. The silicon controlled rectifier according to claim 7, wherein the width D2 is 0.4-10 micrometers, and the width S is 1-2 micrometers.

9. A method for manufacturing a silicon controlled rectifier, comprising steps of:
   providing a P-type substrate;
   forming an N-type well and a P-type well in the P-type substrate, wherein an interface is provided between the N-type well and the P-type well, the interface extending from a bottom of the N-type well and the P-type well to a top surface of the substrate;
   forming a first P-type heavily doped region and a first P-type heavily doped region which form an anode of the silicon controlled rectifier at an upper portion of the N-type well, wherein the first N-type heavily doped region M is closer to the interface than the first P-type heavily doped region, and an active region between the first N-type heavily doped region and the interface is composed of the N-type well;
   forming a second P-type heavily doped region and a second N-type heavily doped region which form a cathode of the silicon controlled rectifier at an upper portion of the P-type well, wherein the second N-type heavily doped region is closer to the interface than the second P-type heavily doped region; and
   forming shallow trench isolation between the second N-type heavily doped region and the interface, wherein the shallow trench isolation is adjacent to the second N-type heavily doped region, and an active region between the shallow trench isolation and the interface is composed of the P-type well.

10. The method according to claim 9, further comprising adjusting a width D1 of the active region between the first N-type heavily doped region and the interface to adjust a trigger voltage of the silicon controlled rectifier.

11. The method according to claim 10, wherein the width D1 is 1-2 micrometers.

12. The method according to claim 10, further comprising adjusting a width D3 of the active region between the shallow trench isolation and the interface to adjust the trigger voltage of the silicon controlled rectifier.

13. The method according to claim 12, wherein the width D3 is adjusted in a range of 1-5 micrometers.

14. The method according to claim 9, wherein the active region of the N-type well is provided between the first P-type heavily doped region and the first N-type heavily doped region.

15. The method according to claim 14, further comprising adjusting a width D2 of the first N-type heavily doped region and a width S of the active region between the first P-type heavily doped region and the first N-type heavily doped region to adjust a no-snapback state of the silicon controlled rectifier.

16. The method according to claim 15, wherein the width D2 is adjusted in a range of 0.4-10 micrometers, and the width S is adjusted in a range of 1-2 micrometers.

\* \* \* \* \*